INSULATED GATE FIELD EFFECT TRANSISTOR TRANSLATING CIRCUIT

Filed July 19, 1963 2 Sheets-Sheet 1

INVENTOR.
LEOPOLD A. HARWOOD
BY
Eugene M. Whitacre
ATTORNEY

INSULATED GATE FIELD EFFECT TRANSISTOR TRANSLATING CIRCUIT

Filed July 19, 1963 2 Sheets-Sheet 2

INVENTOR.
LEOPOLD A. HARWOOD
BY
Eugene M. Whitacre
ATTORNEY 3,307,110

INSULATED GATE FIELD EFFECT TRANSISTOR TRANSLATING CIRCUIT

Leopold A. Harwood, Cherry Hill, N.J., assignor to Radio Corporation of America, a corporation of Delaware
Filed July 19, 1963, Ser. No. 296,305
9 Claims. (Cl. 325—451)

This invention relates in general to electrical circuits employing semiconductor devices and more particularly to signal translating circuits which include insulated-gate field-effect transistors.

One type of insulated-gate field-effect transistor, includes source and drain electrodes formed on a substrate of semiconductor material. A gate electrode, which is insulated from the source and drain electrodes, controls the conductivity of a current path between the source and drain electrodes. Circuits embodying the invention include an insulated-gate field-effect transistor of this type connected in a manner to include an impedance element, such as a resistor between the source electrode and a point of reference potential. It has been found that the design and operation of such circuits are materially improved by connecting the semiconductor substrate directly to the source electrode.

The novel features which are considered characteristic of the invention are set forth with particularity in the appended claims. The invention itself, however, both as to its organization and method of operation as well as additional objects and advantages thereof will best be understood from the accompanying drawings in which:

Figure 1:
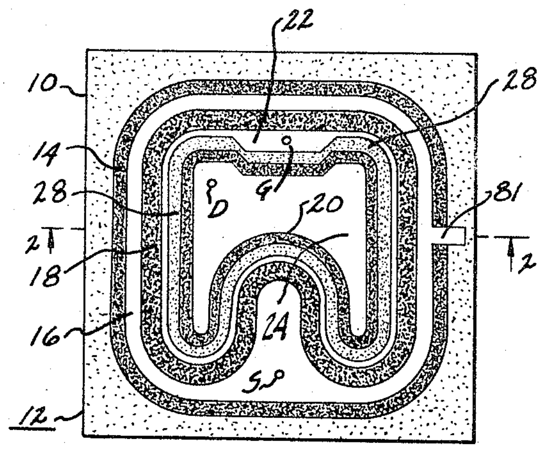
FIGURE 1 is a diagrammatic view of an insulated-gate field-effect transistor suitable for use in circuits embodying the invention.

Referring now to the drawings and particularly to FIGURE 1, a field-effect transistor 10 which may be used with circuits embodying the invention includes a substrate of a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example, lightly doped P-type silicon of 100 ohm-cm. material.

In the manufacture of the device shown in FIGURE 1 heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
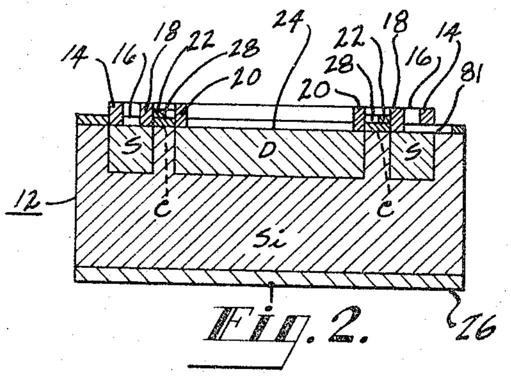
FIGURE 2 is a cross section view taken along section line 2—2 of FIGURE 1.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross section view taken along section 2—2 of FIGURE 1, shows the source-drain regions labelled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1 in which the lightly stippled area between the outside boundary and the first darker zone 14 is grown silicon dioxide. The white area 16 is the metal electrode corresponding to the source electrode. Dark or more heavily stippled zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. The input resistance of the device as measured between the gate and source electrodes at low frequencies is of the order of $10^{14}$ ohms. The layer of grown silicon dioxide 28 on which the gate electrode 22 is mounted, overlies an inversion layer or conductive channel C connecting the source and drain regions. The gate electrode 22 is displaced towards the source region and may, if desired, overlie the edge of the deposited silicon dioxide layer 18.

Reference is now made to FIGURE 2 of the drawings. The boundaries seperating the source and drain regions S and D and the body of silicon substrate 12 effectively operate as a pair of rectifying junctions coupling the silicon substrate 12 to the source and drain electrodes 16 and 24, in such a manner that a positive bias voltage applied to the substrate with respect to the drain and source electrodes 16 and 24 renders the rectifying junction conductive, i.e., forward biased. The drain and source electrodes are connected to each other by a conductive channel C. The majority current carriers (in this case electrons) flow from source to drain in this thin channel region close to the surface. The conductive channel C is shown in FIGURE 2.

Figure 3:
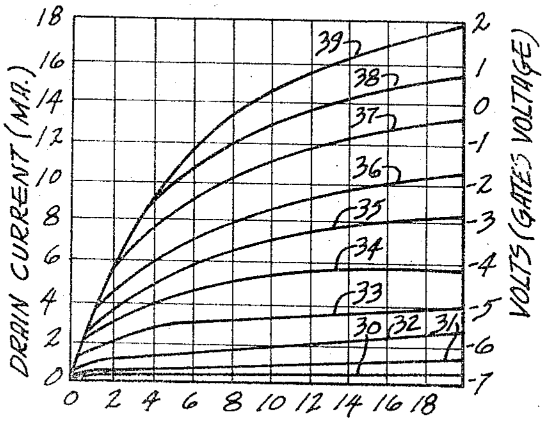
FIGURE 3 is a graph showing a family of drain current versus source-to-drain voltage curves for various values of gate-to-source voltages for the transistor of FIGURE 1.
Figure 4:
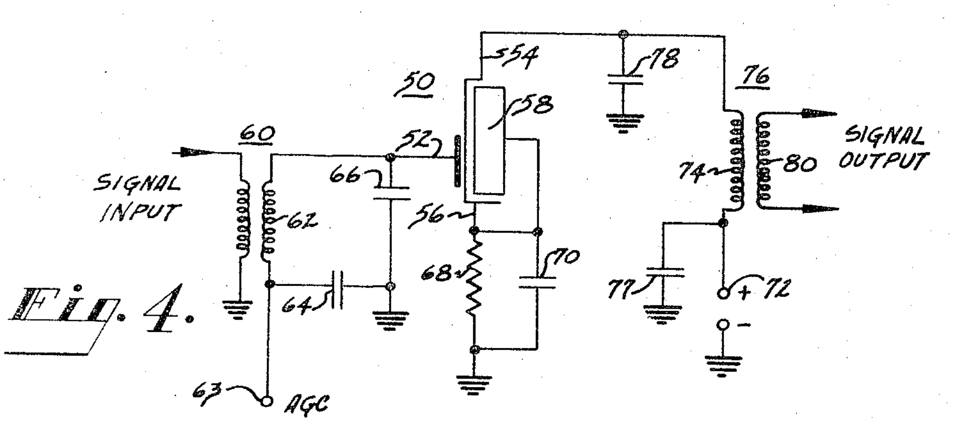
FIGURE 4 is a schematic circuit diagram of a high frequency amplifier circuit embodying the invention.

FIGURE 3 is a family of curves 30–39 illustrating the drain current versus drain voltage characteristic of the transitsor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38–39 represent positive gate voltage relative to the source, and the curves 30–36 represent negative gate voltages relative to the source.

The location of the zero bias curve is selected during the manufacture of the transistor, i.e., by controlling the time or the temperature, or both, during the step of the process in which the silicon dioxide layer 28, shown in FIGURES 1 and 2, is grown. The longer the transistor is baked and the higher the temperature in a dry oxygen atmosphere the larger the drain current will be for a given amount of drain voltage at zero bias between the source and gate electrodes.

Reference is now made to FIGURE 4, which is a schematic circuit diagram of a tuned, gain-controlled amplifier circuit including an insulated-gate field-effect transistor 50 similar to the one described in FIGURES 1 and 2. The transistor 50 has an input or gate electrode 52, an output or drain electrode 54, a common or source electrode 56, and a substrate 58 of semiconductor material. High frequency signals to be amplified, such as R-F or I-F signals, are applied to the primary winding of a coupling transformer 60 having a secondary winding 62. One end of the secondary winding 62 is connected to the gate electrode 52 and the other end of the secondary winding 62 is connected to the gate electrode 52 and the other end of the secondary winding is connected to an automatic gain control (AGC) terminal 63 to which a gain controlling voltage, referenced to ground, is applied. The terminal 63 is grounded for signal frequencies by a bypass capacitor 64. The secondary winding 62 is tuned to the desired signal frequencies by a tuning capacitor 66 which is connected between the gate electrode 52 and ground.

The source electrode 56 is connected through a source resistor 68, bypassed for signal frequencies by a capacitor 70, to ground. Capacitor 70 may be of a value at the signal frequency to completely or partially bypass the applied signals. The D.-C. voltage developed across the source resistor 68, taken in combination with the AGC voltage, establishes the operating point for the amplifier. In the present instance the amplifier is biased for operation at a point providing linear amplification of the applied high frequency signals, such as on the curve 36 of FIGURE 3.

The collector electrode 54 is coupled to a source of operating potential 72 through the primary winding 74 of an output transformer 76. The operating potential source is bypassed for signal frequencies by a capacitor 77, and the primary winding 74 is tuned to the desired signal frequency by capacitor 78. Amplified signals developed across the secondary winding 80 of the transformer 76 are applied to a utilization circuit, not shown.

The semiconductor substrate 58 is connected directly to the source electrode 56 of the insulated-gate field-effect transistor 50. This connection may be made in any of several ways, such as by connecting the conductive header 26, as shown in FIGURE 2 to the conductive terminal for the source electrode, or by providing a built-in connection between the source electrode and the semiconductor substrate during the manufacture of the transistor. Such a connection may be provided by a conductive electrode 81 (see FIGURE 1), overlying and in non-rectifying or ohmic contact with the substrate. The electrode 81 may comprise an integral part of the source electrode 16, and is positioned over the substrate 12 at a location where the grown silicon dioxide has been removed. The latter method of connection may be desired when the transistor device is used as a portion of an integrated circuit comprising active and passive devices on a single semiconductor wafer.

A circuit of the type shown and described in connection with FIGURE 4 provides several advantages as compared to circuits where the semiconductor substrate 58 is left unconnected, or is grounded. It has been observed that the substrate 58 exhibits a control over the current flowing between the source and drain electrodes 56 and 54. With the substrate 58 at a negative potential relative to the source electrode 56, the control exerted by the substrate is believed to result from a field effect action. The semiconductor substrate control on the drain current manifests itself in two ways: first, signal voltage appearing between the substrate and source electrode modulates the drain current, and second, the direct voltage at the substrate relative to the source electrode exerts a control on the transconductance as measured by the unit change in gate electrode voltage per unit change in drain current.

With the semiconductor substrate 58 directly connected to the source electrode 56, no D.-C. or signal voltages can be developed between these electrodes, and accordingly field effect control of the current flowing between the source electrode 56 and drain electrode 54 as a function of substrate voltage is eliminated. The connection of the substrate to the source electrode 56 permits greater maximum transductance and less severe bypassing requirements for the source resistor 68 as compared to circuits wherein the substrate is left unconnected, or is grounded.

The greater maximum transconductance at a selected gate-to-source biasing point will be understood from the following explanation. Assuming a fixed D.-C. bias voltage between the gate electrode 52 and the source electrode 56, as the substrate becomes more negative relative to the source electrode the drain current is reduced. In addition to the reduction in drain current, the more negative substrate-to-source voltage has the effect of compressing the curves 30–39 of FIGURE 3 thereby reducing the transconductance of the transistor.

If the substrate 58 is left unconnected, a negative direct voltage, related to the applied signal level, is developed thereon relative to the source electrode 56. It is believed that the voltage developed at the substrate 58 results from a capacitive coupling of the signal applied at the gate electrode 52, to the substrate 58, and the rectification of this signal through the rectifying junction which exists between the substrate 58 and the source electrode 56. This negative substrate voltage reduces the drain current and transconductance of the transistor at the assumed gate-to-source biasing point.

If the substrate 58 is grounded, the signal dependent direct voltage which is developed as described above is added to the voltage developed across the source resistor 68 to provide a composite negative voltage at the substrate 58 relative to the source electrode 56. As mentioned above, this reduces drain current and the transconductance of the circuit at the selected gate-to-source operating point.

The less severe bypassing requirements of the source resistor 68 resulting from the substrate-to-source connection of FIGURE 4 may be explained as follows. First, the capacitive reactance at signal frequencies required to bypass a source resistor is related to the input impedance of the device as is known. The higher the device input impedance the less the capacitive reactance required to achieve a desired degree of signal bypassing around the source resistor. The input impedance of the circuit as measured from the gate electrode 52 is very high, thus requiring a relatively small valued capacitor to achieve substantially complete bypassing. However, the input impedance as measured from the substrate 58 is much lower than that as measured from the gate electrode 52. If the substrate is left unconnected or is grounded, signal voltages developed across the source resistor 68 appear between the source electrode 56 and the substrate 58. Accordingly, with such circuit connections, to prevent this signal voltage from operating degeneratively via substrate control, a relatively larger valued bypass capacitor 70 would be required than is necessitated when the signal voltage across the source resistor 68 does not appear between the source electrode 56 and substrate 58 as is the case with the circuit of FIGURE 4.

A further advantage of the circuit of FIGURE 4 resides in the fact that the substrate 58 is held at a positive potential relative to ground, so that the total voltage existing across the drain-to-substrate rectifying junction is reduced. Accordingly, a greater flexibility in the selection of the transistor device is permitted since the reverse breakdown characteristics required of the substrate-to-source and the substrate-to-drain rectifying junctions is reduced.

Figures 5, 6:
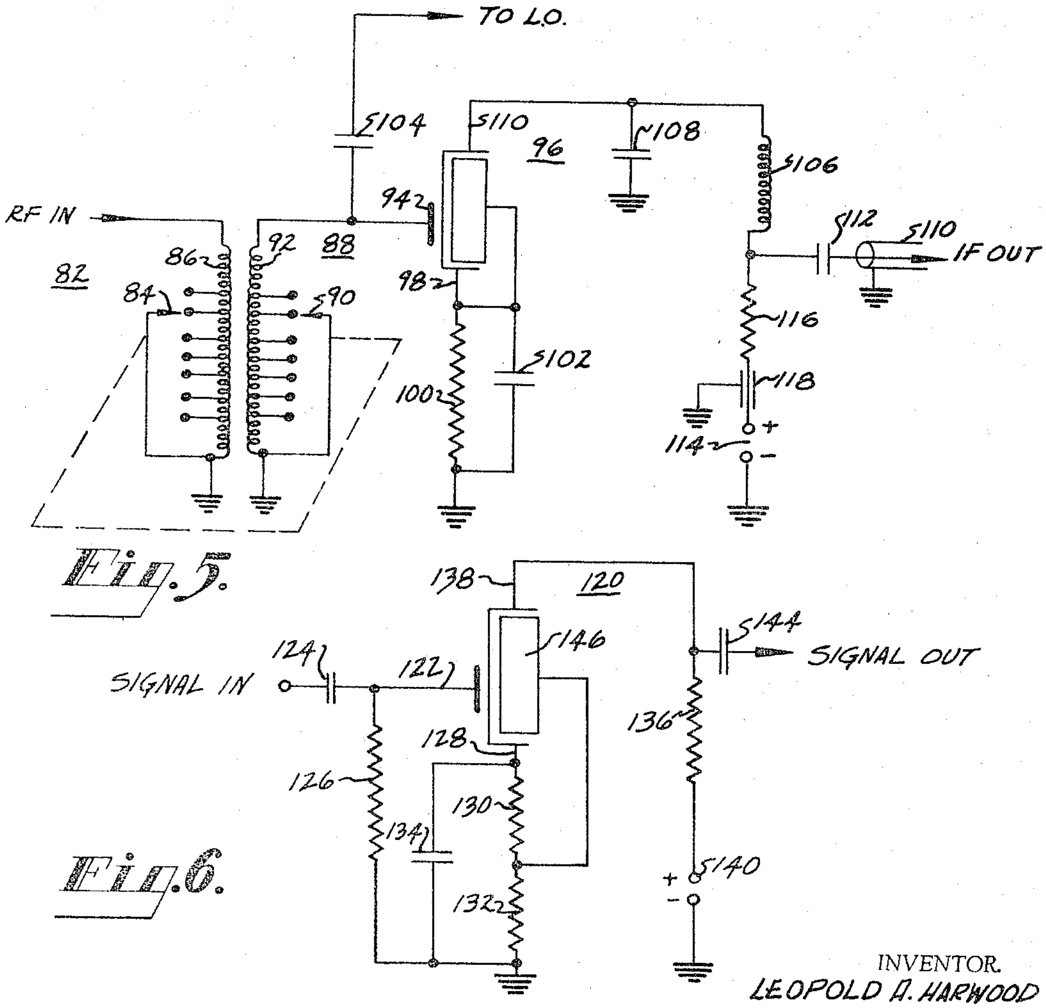
FIGURE 5 is a schematic circuit diagram of a mixer circuit embodying the invention.
FIGURE 6 is a schematic circuit diagram of an amplifier circuit embodying a modification of the invention.

The embodiment of the invention shown in FIGURE 5 is a frequency converter stage useful in superheterodyne radio receivers, such as television receivers. Radio frequency (R-F) signals from a source, not shown, are applied to a primary circuit 82 which is tunable to different signal frequencies by a rotor 84 which is adjustable to short out various portions of the primary circuit inductance 86.

Signals developed at the primary circuit 82 are coupled to a secondary circuit 88 which is likewise tunable by a rotor 90 to selectively short out portions of the secondary circuit inductor 92. The rotors 84 and 90 are ganged for unicontrol operation, and may be regarded as wafer switch type tuners commonly used in television receivers.

The secondary circuit 88 is coupled to a gate electrode 94 of an insulated-gate field-effect transistor 96. The source electrode 98 of the transistor 96 is connected to ground through a biasing resistor 100 which is bypassed for signal frequencies by a capacitor 102. Signals from a local oscillator, not shown, are coupled to the gate electrode 94 through an oscillator injection capacitor 104.

The nonlinear interaction of the R-F signals with the local oscillator wave in the transistor 96 causes the signal modulated R-F wave to be converted to a correspondingly modulated intermediate frequency (I-F) wave. Generally the selected I-F wave is of a frequency equal to the difference in frequency between the local oscillator and R-F waves. The I-F wave is developed across a parallel resonant circuit comprising an inductor 106 which is tuned to the I-F frequency by a capacitor 108 in combination with the capacitance between the conductors of a coaxial output cable 110. A coupling capacitor 112 couples the cable 110 to the inductor 106. The capacitances of the cable 110 and of the capacitor 108 are effectively in series across the inductor 106, and the output signal is derived across the cable 110 capacitance.

The drain electrode 110 is connected to the positive terminal of an operating potential supply source 114 through the inductor 106 and a resistor 116. The resistor 116 damps the parallel resonant I-F output circuit to provide the desired I-F bandwidth. A feedthrough capacitor 118 is connected to bypass I-F waves around the source of operating potential 114.

The advantages of the circuit of FIGURE 5 are the same as outlined above in connection with FIGURE 4.

FIGURE 6 is a schematic circuit diagram of a resistance-capacitance coupled amplifier illustrating a modification of the invention wherein the substrate electrode is effectively tapped down on the source resistor of the amplifier. In this circuit an insulated-gate field-effect transistor 120 includes a gate circuit electrode 122 to which a signal is applied through a coupling capacitor 124. The gate 122 is returned to ground for direct currents through a gate resistor 126. The transistor 120 also includes a source electrode 128 which is connected to ground through a pair of series connected resistors 130 and 132. A signal bypass capacitor 134 is also connected between the source electrode 128 and ground.

Amplified signal energy is developed across an output resistor 136 which is connected between the drain electrode 138 and a source of operating potential 140. The output signals are coupled through a capacitor 144 to a suitable utilization circuit, not shown.

Transistor 120 also includes a semiconductor substrate 146 which is connected to the junction between the resistors 130 and 132. The connection of the substrate 146 as shown in FIGURE 6 provides intermediate effects between the conditions observed when the substrate is referenced to (1) ground, and (2) to the source electrode.

What is claimed is:

1. An electrical circuit comprising,
an insulated-gate field-effect transistor having source, drain and gate electrodes formed on a substrate of semiconductor material,
circuit means interconnecting said gate, source and drain electrodes so that said transistor operates as an active device in said electrical circuit, said circuit means including an impedance element connected to said source electrode, and
means connecting said substrate to said source electrode by a direct current path exclusive of said impedance means.

2. A signal translating circuit comprising,
an insulated-gate field-effect transistor having source, drain and gate electrodes formed on a substrate of semiconductor material,
circuit means interconnecting said gate, source and drain electrodes so that said transistor operates as an active device in said signal translating circuit, said circuit means including a point of reference potential and an impedance element connected between said source electrode and said point of reference potential, and
means connecting said substrate to said source electrode in a direct current path exclusive of said point of reference potential.

3. A signal translating circuit comprising,
an insulated-gate field-effect transistor having source, drain and gate electrodes formed on a substrate of semiconductor material,
circuit means including input, output and common terminals connected respectively to said gate, drain and source electrodes with an impedance element connected between said source electrode and said common terminal so that said transistor operates as an active device in said signal translating circuit, and
means connecting said substrate to said source electrode in a direct current path exclusive of said common terminal.

4. A signal translating circuit comprising,
an insulated-gate field-effect transistor having source, drain and gate electrodes formed on a semiconductor substrate,
means providing an input circuit coupled between said gate electrode and a point of reference potential,
means providing an output circuit coupled between said drain electrode and said point of reference potential,
resistive means connected between said source electrode and said point of reference potential, and
means providing a direct current path between said substrate and said source electrode exclusive of at least a portion of said resistive means.

5. An amplifier circuit comprising,
an insulated-gate field-effect transistor having source, drain and gate electrodes formed on a semiconductor substrate,
means providing a signal input circuit coupled between said gate electrode and a point of reference potential,
means providing a signal output circuit coupled between said drain electrode and said point of reference potential,
a resistor and a capacitor connected in parallel between said source electrode and said point of reference potential, and
means directly connecting said substrate to said source electrode.

6. A frequency converter circuit comprising,
an insulated-gate field-effect transistor having source, drain and gate electrodes formed on a semiconductor substrate,
means providing a signal input circuit coupled between said gate electrode and a point of reference potential,
means providing a source of oscillating waves coupled to said gate electrode, said oscillating waves and signals from said input circuit being separated in frequency by an amount corresponding to an intermediate frequency,
means providing an intermediate frequency output circuit coupled between said drain electrode and said point of reference potential,
a resistor and a capacitor connected in parallel between said source electrode and said point of reference potential, and
means directly connecting said substrate to said source electrode.

7. An amplifier circuit comprising,
an insulated-gate field-effect transistor having source, drain and gate electrodes formed on a semiconductor substrate,
means providing a signal input circuit coupled between said gate electrode and a point of reference potential,
means providing a signal output circuit coupled between said drain electrode and said point of reference potential,
a pair of resistors connected in series between said source electrode and said point of reference potential,
a signal bypass capacitor connected in parallel with at least one of said resistors, and
means providing a direct current path between said substrate and the junction between said pair of resistors.

8. A signal translating circuit comprising,
an insulated-gate field-effect transistor having source, drain and gate electrodes formed on a semiconductor substrate,
means providing an input circuit coupled between said gate electrode and a point of reference potential,
a signal output circuit and a source of direct operating voltage connected in series between said drain electrode and said point of reference potential,
a resistor connected between said source electrode and said point of reference potential, and means for directly connecting said substrate electrode to said source electrode so that the reverse voltage as measured between said drain electrode and said substrate is less than the voltage between said drain electrode and said point of reference potential by an amount equal to the voltage across said resistor thereby reducing the reverse drain-to-substrate voltage breakdown requirements of the transistor.

9. An electrical circuit comprising,
an insulated-gate field-effect transistor having source, drain and gate electrodes formed on a semiconductor substrate,
means providing an input circuit coupled between said gate electrode and a point of reference potential,
means providing an output circuit coupled between said drain electrode and said point of reference potential,
resistive means connected between said source electrode and said point of reference potential,
biasing means including said resistive means providing a gate-to-source biasing voltage to establish a predetermined operating point for said circuit, and
means providing a direct current path between said substrate and said source electrode exclusive of at least a portion of said resistive means to enhance the transconductance of said device at said operating point.

No references cited.

KATHLEEN H. CLAFFY, *Primary Examiner.*
R. S. BELL, *Assistant Examiner.*